(12) United States Patent
Hirakawa

(10) Patent No.: US 6,787,706 B2
(45) Date of Patent: Sep. 7, 2004

(54) CERAMIC CIRCUIT BOARD

(75) Inventor: Tetsuo Hirakawa, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/079,300

(22) Filed: Feb. 19, 2002

(65) Prior Publication Data

US 2002/0112882 A1 Aug. 22, 2002

(30) Foreign Application Priority Data

Feb. 21, 2001 (JP) .......................................... P2001-45058
Feb. 21, 2001 (JP) .......................................... P2001-45059

(51) Int. Cl.$^7$ ................................................. H05K 1/03
(52) U.S. Cl. ....................................... 174/255; 174/260
(58) Field of Search ................................. 174/250, 261, 174/255–258; 361/777–779

(56) References Cited

U.S. PATENT DOCUMENTS

| | | | | |
|---|---|---|---|---|
| 4,606,788 A | * | 8/1986 | Moran .......................... | 216/13 |
| 4,632,857 A | * | 12/1986 | Mallory, Jr. .................. | 428/209 |
| 4,963,701 A | * | 10/1990 | Yasumoto et al. ........... | 174/256 |
| 5,032,694 A | * | 7/1991 | Ishihara et al. .............. | 174/256 |
| 5,242,535 A | * | 9/1993 | Tamhaukar et al. ........... | 216/13 |
| 5,298,687 A | * | 3/1994 | Rapoport et al. ............ | 174/261 |
| 5,953,214 A | * | 9/1999 | Dranchak et al. ............ | 361/767 |
| 6,479,136 B1 | * | 11/2002 | Nakanishi .................... | 428/209 |

FOREIGN PATENT DOCUMENTS

JP  11-340600  12/1999

* cited by examiner

Primary Examiner—David A. Zarneke
Assistant Examiner—Jeremy Norris
(74) Attorney, Agent, or Firm—Hogan & Hartson, LLP

(57) ABSTRACT

A ceramic circuit board that protects a metallized wiring layer from fusion when a large electric current is applied thereto. The ceramic circuit board includes a ceramic substrate, a plurality of metallized wiring layers formed on the ceramic substrate, and a metal circuit plate made of copper, which is attached to part of the metallized wiring layers. The condition, $S \geq 6 \times 10^{-5} i^2$, is fulfilled in the ceramic circuit board, whereby S (mm$^2$) is the sectional area of the metal circuit plate and i (A) the value of a flowing electric current.

18 Claims, 2 Drawing Sheets

CERAMIC CIRCUIT BOARD

BACKGROUND OF THE INVENTION

1. Field of the Invention

The present invention relates to a ceramic circuit board in which a metallized wiring layer is formed on a ceramic substrate, and more particularly to a ceramic circuit board in which a flow of a large electric current is allowed.

2. Description of the Related Art

As a circuit board on which electronic components such as a semiconductor element are mounted and connected, a ceramic circuit board has conventionally been in wide use that is constituted by forming a plurality of metallized wiring layers on a ceramic substrate.

In such a ceramic circuit board, commonly, the ceramic substrate is made of sintered aluminum oxide or mullite, and a plurality of metallized wiring layers are each made of a metal material having a high melting point, such as tungsten, molybdenum, or manganese. The following is an example of methods for manufacturing the ceramic circuit board. In a case where the ceramic substrate is made of sintered aluminum oxide, firstly, a suitable organic binder, plasticizer, or solvent is mixedly added to powder of a starting material such as aluminum oxide, silicon oxide, magnesium oxide, or calcium oxide, to form a slurry. The slurry is then formed into a plurality of ceramic green sheets in accordance with conventionally-known tape forming techniques, such as a doctor blade method or calendar roll method. Secondly, a suitable organic binder, plasticizer, or solvent is mixedly added to high melting point metal powder, such as tungsten or molybdenum, to form a metal paste. The metal paste is then printed onto the ceramic green sheet in a predetermined pattern in accordance with a printing technique such as a screen printing method. Lastly, the ceramic green sheets, onto which the metal paste is printed in a predetermined pattern, are vertically stacked one upon another as required and are then fired in a reducing atmosphere at a temperature of approximately 1600° C. As a result, the ceramic green sheets and the metal paste are formed in one piece by sintering, thereby realizing the ceramic circuit board.

Note that the metallized wiring layer typically has its exposed surface coated with a metal material of certain thickness that is highly corrosion-resistant and exhibits excellent wettability with respect to an adhesive material such as solder (nickel, for example) in accordance with a technique such as a plating method. By doing so, it is possible to effectively prevent corrosion due to oxidation and to allow an electronic component such as a semiconductor element to be firmly connected to the metallized wiring layer with use of an adhesive agent such as solder.

However, the conventional ceramic circuit board has the following disadvantage. The metallized wiring layer is made of a high melting point metal material such as molybdenum or tungsten. Since molybdenum and tungsten have a resistivity which is as high as $5.2 \times 10^{-6}$ $\Omega \cdot cm$ or above (molybdenum: $5.2 \times 10^{-6}$ $\Omega \cdot cm$; and tungsten: $5.64 \times 10^{-6}$ $\Omega \cdot cm$), the metallized wiring layer has high electrical resistance. Therefore, in the ceramic circuit board on which an IGBT (Insulated Gate Bipolar Transistor) or power-FET (Field Effect Transistor) is mounted, when a large electric current of approximately 10 A is applied to the metallized wiring layer, intense Joule heat is generated, and the metallized wiring layer suffers from fusion. As a result, the ceramic circuit board is no longer capable of functioning properly.

In an attempt to solve the drawback described above, the metallized wiring layer has been made larger in thickness and width. However, this causes an increase in stress developed in the inner part of the metallized wiring layer, resulting in a crack or break. Furthermore, it is inevitable that the ceramic circuit board as a whole has an unduly large size.

SUMMARY OF THE INVENTION

The invention has been accomplished in view of the above-described drawbacks with the conventional art, and accordingly it is an object of the invention to provide a compact ceramic circuit board which admits of a flow of a large electric current.

The invention provides a ceramic circuit board comprising:

a ceramic substrate;

a plurality of metallized wiring layers formed on the ceramic substrate; and a metal circuit plate made of copper, which is attached to part of the metallized wiring layers, wherein a condition: $S \geq 6 \times 10^{-5} \, i^2$ is fulfilled, wherein S is a sectional area ($mm^2$) of the metal circuit plate and i is a value (A) of a flowing electric current.

According to the invention, a copper-made metal circuit plate having a low resistivity is placed in the region of the metallized wiring layer through which a large current of approximately 10 A flows, and the metal circuit plate is so designed as to satisfy a condition: $S \geq 6 \times 10^{-5} \, i^2$, wherein S represents the sectional area ($mm^2$) and i represents the value of the flowing electric current (A). Therefore, even if a large electric current of approximately 10 A is applied to the metallized wiring layer, the electric current is allowed to flow smoothly therethrough via the metal circuit plate, and simultaneously generation of intense Joule heat can be prevented effectively. As a result, the ceramic circuit board is capable of functioning properly and stably for a longer period of time.

The invention further provides a ceramic circuit board comprising:

a ceramic substrate;

a plurality of metallized wiring layers formed on the ceramic substrate; and a metal circuit plate made of aluminum, which is attached to part of the metallized wiring layers, wherein a condition: $S \geq 9 \times 10^{-5} \, i^2$ is fulfilled, wherein S is a sectional area ($mm^2$) of the metal circuit plate and i is a value (A) of a flowing electric current.

According to the invention, an aluminum-made metal circuit plate having a low resistivity is placed in the region of the metallized wiring layer through which a large current of approximately 10 A flows, and the metal circuit plate is so designed as to satisfy a condition: $S \geq 9 \times 10^{-5} \, i^2$, wherein S represents the sectional area ($mm^2$) and i represents the value of the flowing electric current (A). Therefore, even if a large electric current of approximately 10 A is applied to the metallized wiring layer, the electric current is allowed to flow smoothly therethrough via the metal circuit plate, and simultaneously generation of intense Joule heat can be prevented effectively. As a result, the ceramic circuit board is capable of functioning properly and stably for a longer period of time.

In the invention, it is preferable that the metal circuit plate has a surface plated with a layer that is made of a nickel-phosphorus amorphous alloy containing phosphorus in an amount of 8 to 15 wt %.

In the invention, it is preferable that the ceramic substrate has a thickness of 700 μm or less, and that the plate layer has a thickness ranging from 1.5 to 3 μm.

In the invention, it is preferable that the metallized wiring layer is made of a silver-copper eutectic alloy added with at least one of titanium, zirconium, hafnium, and hydrides thereof.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
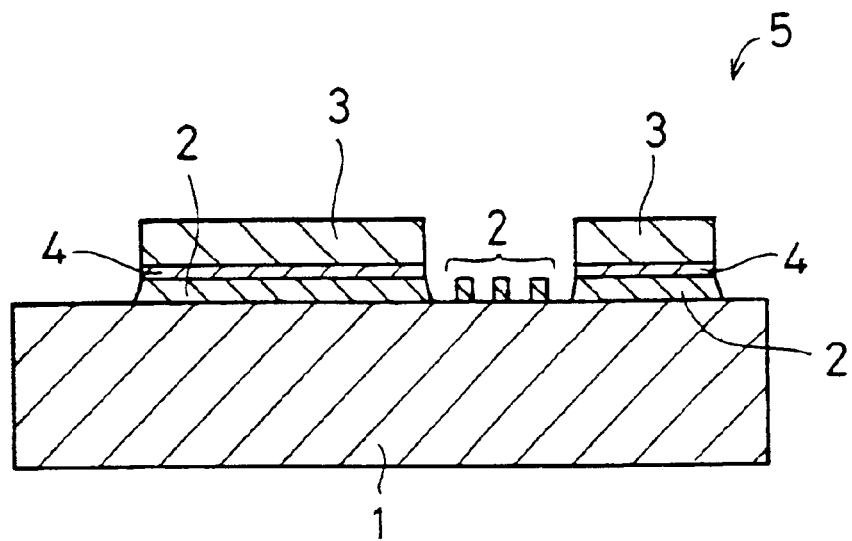
FIG. 1 is a cross-sectional view showing a first embodiment of a ceramic circuit board according to the invention.

Now referring to the drawings, preferred embodiments of the invention are described below.

FIG. 1 is a cross-sectional view showing a first embodiment of a ceramic circuit board 5 according to the invention. The ceramic circuit board 5 includes a ceramic substrate 1, a metallized wiring layer 2, and a metal circuit plate 3.

The ceramic substrate 1 is rectangular-shaped and has a plurality of metallized wiring layers 2 attached to the top surface thereof. The metal circuit plate 3 is placed in part of the metallized wiring layers 2.

The ceramic substrate 1 serves as a supporting member for supporting the metallized wiring layer 2, and is made of an electrically insulating material such as sintered aluminum oxide, mullite, silicon nitride, aluminum nitride or silicon carbide.

Hereinafter, a description will be given as to a method for manufacturing the ceramic substrate 1. For example, in a case where the ceramic substrate 1 is made of sintered aluminum oxide, firstly, a suitable organic binder, plasticizer, or solvent is mixedly added to a starting powder material, such as aluminum oxide, silicon oxide, magnesium oxide, or calcium oxide, to form a slurry. The slurry is then formed into a ceramic green sheet (ceramic raw sheet) in accordance with a conventionally-known doctor blade method or calendar roll method. Secondly, the ceramic green sheet is subjected to a suitable stamping process to take a predetermined shape, and a plurality of sheets are stacked one upon another as required to form a molded body. Lastly, the molded body is fired at a temperature of approximately 1600° C., thereby realizing the ceramic substrate 1.

Another method for manufacturing the ceramic substrate 1 will be described. Firstly, a suitable organic solvent is mixedly added to a starting powder material such as aluminum oxide to obtain an adjusted starting powder material. Thereafter, the starting powder material is molded into a predetermined shape by a press molding technique, thereby forming a molded body. Subsequently, the molded body is fired at a temperature of approximately 1600° C. Consequently, the ceramic substrate 1 is fabricated.

Moreover, the ceramic substrate 1 has, on its surface, a plurality of metallized wiring layers 2 which serve as transmission paths for supplying predetermined electric signals or power to an electronic component to be mounted on the ceramic substrate 1.

The metallized wiring layer 2 is made of a high melting point metal material such as tungsten, molybdenum, or manganese. For example, a suitable organic binder, plasticizer, or solvent is mixedly added to tungsten powder to form a metal paste. The metal paste is previously printed onto the surface of the ceramic green sheet (ceramic raw sheet), which is formed into the ceramic substrate 1, in a predetermined pattern by firing in accordance with the conventionally-known screen printing method. Thereby, the metallized wiring layer 2 having a predetermined thickness is coated onto the top surface of the ceramic substrate 1 in a predetermined pattern.

It is preferable that a metal material which has excellent conductivity, is highly corrosion-resistant, and has excellent wettability with respect to a brazing filler material (nickel or gold, for example) is coated onto the surface of the metallized wiring layer 2 in a thickness ranging from 1 to 20 μm in accordance with the plating method. This makes it possible to effectively protect the metallized wiring layer 2 against corrosion due to oxidation and to allow an electrode of the electronic component, which is mounted on the metallized wiring layer 2, to be firmly bonded to the metallized wiring layer 2 with use of solder or the like.

Moreover, the metal circuit plate 3, made of copper, having a low resistivity (resistivity: $1.72 \times 10^{-6}$ Ω·cm) is placed by brazing in the region of the metallized wiring layer 2 through which a large current of approximately 10 A flows. The metal circuit plate 3 is so designed as to satisfy a condition: $S \geq 6 \times 10^{-5} i^2$, wherein S represents the sectional area (mm$^2$) and i represents the value of the flowing electric current (A) Therefore, even if a large electric current of approximately 10 A is applied to the metallized wiring layer 2, the metal circuit plate 3 enables the electric current to flow smoothly, and simultaneously generation of intense Joule heat can be prevented effectively. As a result, the ceramic circuit board is capable of functioning properly and stably for a longer period of time.

The copper-made metal circuit plate 3 having a predetermined shape is obtained by subjecting a copper ingot (block) to a conventionally-known metal processing method such as a rolling processing method or stamping processing method. The metal circuit plate 3 is placed, via a brazing filler material 4 such as silver solder, in the region of the metallized wiring layer 2 through which a large current of approximately 10 A flows.

In the metal circuit plate 3, its sectional area is defined as S (mm$^2$) and a value of a flowing electric current is defined as i (A). In this case, if the relationship between S and i is given as: $S < 6 \times 10^{-5} i^2$, when a large electric current of approximately 10 A is applied, not only the electric current fails to flow smoothly, but also intense Joule heat is generated, resulting in fusion. In light of this, the metal circuit plate 3 is so designed as to satisfy a condition: $S \geq 6 \times 10^{-5} i^2$, wherein S represents the sectional area (mm$^2$) and i represents the value of the flowing electric current (A).

Further, the copper-made metal circuit plate 3 should preferably be made of oxygen-free-copper. The oxygen-free-copper is free of such a disadvantage that, during brazing, a copper surface undergoes oxidation due to oxygen existing within the copper. Therefore, its use makes it possible to achieve excellent wettability with respect to the brazing filler material 4, and to allow the metal circuit plate 3 to be firmly bonded, via the brazing filler material 4, to the metallized wiring layer 2.

It is preferable that a metal material which has excellent conductivity, is highly corrosion-resistant, and has excellent wettability with respect to solder (nickel, for example) is coated onto the surface of the metal circuit plate 3 in accordance with the plating method. This makes it possible to establish satisfactory electrical connection between the metal circuit plate 3 and external electric circuits, and to allow an electronic component such as a semiconductor element to be firmly bonded, via the solder, to the metal circuit plate 3.

In a case where the metal circuit plate 3 has its surface plated with a layer, the plate layer should preferably be made of a nickel-phosphorus amorphous alloy containing phosphorus in an amount of 8 to 15 wt %. This makes it possible to protect the surface of the plate layer against oxidation and to maintain the wettability with respect to the solder for a longer period of time.

Moreover, where the metal circuit plate 3 has its surface plated with a layer made of a nickel-phosphorus amorphous alloy, if the content of phosphorus relative to nickel is less than 8 wt % or exceeds 15 wt %, formation of the nickel-phosphorus amorphous alloy becomes difficult, with the result that the solder cannot be firmly bonded to the plate layer. Accordingly, where the metal circuit plate 3 has its surface plated with a layer made of a nickel-phosphorus amorphous alloy, the content of phosphorus relative to nickel should preferably be kept within a range of 8 to 15 wt %, more preferably, 10 to 15 wt %.

Further, if the plate layer coated onto the surface of the metal circuit plate 3 is less than 1.5 μm in thickness, the surface of the metal circuit plate 3 cannot be wholly covered with the plate layer. This makes it impossible to effectively protect the metal circuit plate 3 against corrosion due to oxidation. By contrast, if the thickness of the plate layer exceeds 3 μm, a large internal stress is developed inside the plate layer, with the result that the ceramic substrate 1 suffers from warpage or crack. In particular, where the ceramic substrate 1 is made so thin as to have a thickness of 700 μm or less, it is inevitable that warpage or crack appears more notably. Thus, the thickness of the plate layer coated onto the surface of the metal circuit plate 3 should preferably be kept within a range of 1.5 to 3 μm.

Still further, the brazing filler material 4, which is used to braze the metal circuit plate 3 to the metallized wiring layer 2, acts as a bonding member for bonding the metal circuit plate 3 to the metallized wiring layer 2. For example, a brazing filler material made of silver solder (silver-copper eutectic brazing filler material containing silver in an amount of 72 wt % and copper in an amount of 28 wt %) is preferably employed.

The following is a procedure for placing the metal circuit plate 3 in the metallized wiring layer 2 with the use of the brazing filler material 4. Firstly, an organic solvent is mixedly added to powder of the brazing filler material 4 to form a brazing filler paste. The paste is then printed onto the metallized wiring layer 2 in a predetermined shape in accordance with a conventionally-known printing technique such as a screen printing method. Then, the metal circuit plate 3 is placed thereon. Secondly, the component thus obtained is heated in a vacuum, neutral atmosphere, or reducing atmosphere at a predetermined temperature (approximately 900° C. in the case of silver solder) to keep the brazing filler material 4 molten, thereby bonding the top surface of the metallized wiring layer 2 to the under surface of the metal circuit plate 3. As a result, the metal circuit plate 3 is attached, via the brazing filler material 4, to the metallized wiring layer 2.

Thus, according to the ceramic circuit board described above, on the ceramic substrate 1 are mounted electronic components such as an IGBT (Insulated Gate Bipolar Transistor) or power-FET (Field Effect Transistor). The electrodes of the electronic components are connected to the metallized wiring layer 2 and the metal circuit plate 3, and thereby the mounted electronic components are electrically connected to each other via the metallized wiring layer 2 and the metal circuit plate 3. Moreover, the metallized wiring layer 2 is connected to a specified external electric circuit so that the mounted electronic components are electrically connected to the external electric circuit. In this way, it is possible to accomplish the function of the ceramic circuit board.

Next, a second embodiment of the invention will be described with reference to FIG. 2.

Note that, in the figure, the components that play the same or corresponding roles as in the first embodiment will be identified with the same reference symbols.

Figure 2:
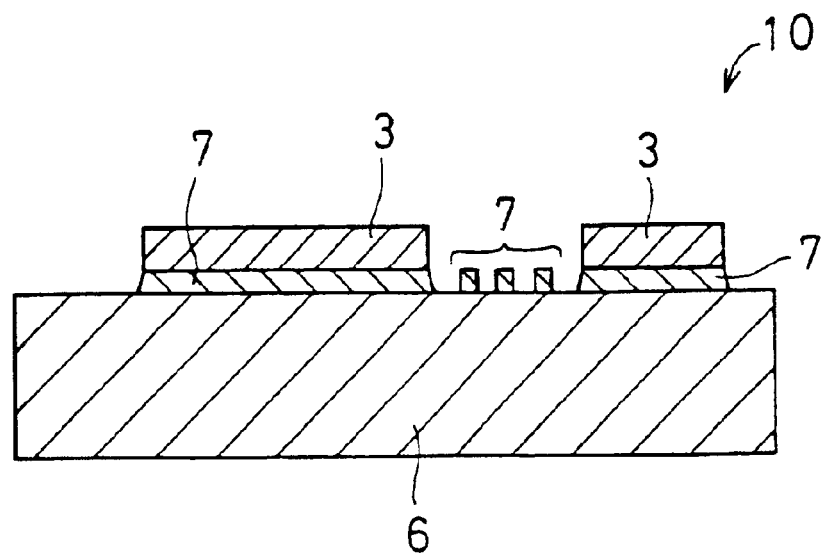
FIG. 2 is a cross-sectional view showing a second embodiment of the ceramic circuit board according to the invention.

A ceramic circuit board 10 shown in FIG. 2 is composed of a ceramic substrate 6, a metallized wiring layer 7, and a metal circuit plate 3.

The ceramic substrate 6 is rectangular-shaped and has a plurality of metallized wiring layers 7 attached to the top surface thereof. The metal circuit plate 3 is placed in part of the metallized wiring layers 7.

The ceramic substrate 6 serves as a supporting member for supporting the metallized wiring layer 7, and is made of an electrically insulating material such as sintered aluminum oxide, mullite, silicon nitride, aluminum nitride or silicon carbide.

Hereinafter, a description will be given as to a method for manufacturing the ceramic substrate 6. For example, in a case where the ceramic substrate 6 is made of sintered silicon nitride, firstly, a suitable organic binder, plasticizer, or solvent is mixedly added to a starting powder material, such as silicon nitride, aluminum oxide, magnesium oxide, or yttrium oxide, to form a slurry. The slurry is then formed into a ceramic green sheet (ceramic raw sheet) in accordance with the conventionally-known doctor blade method or calendar roll method. Secondly, the ceramic green sheet is subjected to a suitable stamping process to take a predetermined shape, and a plurality of sheets are stacked one upon another as required to form a molded body. Lastly, the molded body is fired in anon-oxidative atmosphere, such as an atmosphere containing nitrogen gas, at a high temperature of approximately 1600 to 2000° C., thereby realizing the ceramic substrate 6.

Moreover, the ceramic substrate 6 has, on its surface, a plurality of metallized wiring layers 7 that serve as transmission paths for supplying predetermined electric signals or power to an electronic component to be mounted on the ceramic substrate 6.

The metallized wiring layer 7 is made of a silver-copper eutectic alloy added with at least one of titanium, zirconium, hafnium, and their hydrides in an amount of 2 to 5 wt %. Firstly, a suitable organic binder, plasticizer, or solvent is mixedly added to the alloy powder to form a metal paste. The metal paste is printed onto the ceramic substrate 6 in a predetermined pattern in accordance with the conventionally-known screen printing method. Secondly, the component thus obtained is fired in a vacuum, neutral atmosphere, or reducing atmosphere at a temperature of approximately 900° C. As a result, the metallized wiring layer 7 having a predetermined thickness is coated onto the top surface of the ceramic substrate 6 in a predetermined pattern.

Moreover, the copper-made metal circuit plate 3 having a low resistivity (resistivity: $1.72\times10^{-6}$ Ω·cm) is placed in the region of the metallized wiring layer 7 through which a large electric current of approximately 10 A flows. The metal circuit plate 3 is so designed as to satisfy a condition: $S \geq 6\times10^{-5}i^2$, wherein S represents the sectional area (mm$^2$) and i represents the value of the flowing electric current (A). Therefore, even if a large electric current of approximately 10 A is applied to the metallized wiring layer 7, the metal circuit plate 3 enables the electric current to flow smoothly, and simultaneously generation of intense Joule heat can be prevented effectively. As a result, the ceramic circuit board is capable of functioning properly and stably for a longer period of time.

The copper-made metal circuit plate 3 having a predetermined shape is obtained by subjecting a copper ingot (block) to a conventionally-known metal processing method, such as a rolling processing method or stamping processing method. The metal circuit plate 3 is placed in the region of the metallized wiring layer 7 through which a large current of approximately 10 A flows.

In the metal circuit plate 3, its sectional area is defined as S (mm$^2$) and a value of a flowing electric current is defined as i (A). In this case, if the relationship between S and i is given as: $S<6\times10^{-5}i^2$, when a large electric current of approximately 10A is applied, not only the current fails to flow smoothly, but also intense Joule heat is generated, resulting in fusion. In light of this, the metal circuit plate 3 is so designed as to satisfy a condition: $S \geq 6\times10^{-5}i^2$, wherein S represents the sectional area (mm$^2$) and i represents the value of the flowing electric current (A).

Placement of the metal circuit plate 3 in the metallized wiring layer 7 is achieved by exploiting the reactivity of the metallized wiring layer 7. More specifically, a metal paste (for example, a silver-copper eutectic alloy added with at least one of titanium, zirconium, hafnium, and their hydrides), which is formed into the metallized wiring layer 7, is printed onto the ceramic substrate 6 in a predetermined pattern. Then, on the metal paste printed in the predetermined pattern is placed the metal circuit plate 3. Subsequently, the component thus obtained is fired in a vacuum, neutral atmosphere, or reducing atmosphere at a temperature of approximately 900° C., thereby attaching the metal circuit plate 3 to the metallized wiring layer 7.

Further, the copper-made metal circuit plate 3 should preferably be made of oxygen-free-copper. The oxygen-free-copper is free of such a disadvantage that, during firing, a copper surface undergoes oxidation due to oxygen existing within the copper. Thus, its use makes it possible to achieve excellent wettability with respect to the metal paste, and to allow the metal circuit plate 3 to be firmly bonded to the metallized wiring layer 7.

It is preferable that a 1 to 20 μm-thick metal material which has excellent conductivity, is highly corrosion-resistant, and has excellent wettability with respect to a solder (nickel or gold, for example) is coated onto the exposed surfaces of the metallized wiring layer 7 and the metal circuit plate 3 in accordance with the plating method. This makes it possible to effectively protect the metallized wiring layer 7 and the metal circuit plate 3 against corrosion due to oxidation, to allow the metallized wiring layer 7, the metal circuit plate 3, and the electronic components which are mounted on the metallized wiring layer 7 and the metal circuit plate 3, to be firmly bonded to one another via the electrodes of the electronic components, and to establish satisfactory electrical connection between the metallized wiring layer 7 or the metal circuit plate 3 and the external electric circuits.

In a case where the metallized wiring layer 7 and the metal circuit plate 3 have their surfaces plated with a layer, the plate layer should preferably be made of a nickel-phosphorus amorphous alloy containing phosphorus in an amount of 8 to 15 wt %. This makes it possible to protect the surface of the plate layer against oxidation and to maintain the wettability with respect to the solder for a longer period of time.

Moreover, where the metallized wiring layer 7 and the metal circuit plate 3 have their surfaces plated with a layer made of a nickel-phosphorus amorphous alloy, if the content of phosphorus relative to nickel is less than 8 wt % or exceeds 15 wt %, formation of the nickel-phosphorus amorphous alloy becomes difficult, with the result that the solder cannot be firmly bonded to the plate layer. Accordingly, where the metallized wiring layer 7 and the metal circuit plate 3 have their surfaces plated with a layer made of a nickel-phosphorus amorphous alloy, the content of phosphorus relative to nickel should preferably be kept within a range of 8 to 15 wt %, more preferably, 10 to 15 wt %.

Further, if the plate layer coated onto the surfaces of the metallized wiring layer 7 and the metal circuit plate 3 is less than 1.5 μm in thickness, the surfaces of the metallized wiring layer 7 and the metal circuit plate 3 cannot be wholly covered with the plate layer. This makes it impossible to effectively protect the metallized wiring layer 7 and the metal circuit plate 3 against corrosion due to oxidation. By contrast, if the thickness of the plate layer exceeds 3 μm, a large internal stress is developed inside the plate layer, and thus the ceramic substrate 6 suffers from warpage or crack. In particular, where the ceramic substrate 6 is made so thin as to have a thickness of 700 μm or less, it is inevitable that warpage or crack appears more notably. Thus, the thickness of the plate layer coated onto the surfaces of the metallized wiring layer 7 and the metal circuit plate 3 should preferably be kept within a range of 1.5 to 3 μm.

Thus, according to the ceramic circuit board described above, on the ceramic substrate 6 are mounted electronic components such as an IGBT (Insulated Gate Bipolar Transistor) or power-FET (Field Effect Transistor). The electrodes of the electronic components are connected to the metallized wiring layer 7 and the metal circuit plate 3, and thereby the mounted electronic components are electrically connected to each other via the metallized wiring layer 7 and the metal circuit plate 3. Moreover, the metallized wiring layer 7 is connected to a specified external electric circuit so that the mounted electronic components are electrically connected to the external electric circuit. In this way, it is possible to accomplish the function of the ceramic circuit board.

It should be noted that the invention is not limited to the above-described embodiments and examples and therefore various changes and modifications may be made without departing from the spirit or scope of the invention. For example, although, in the above-described examples, a silver-copper eutectic brazing filler material is used as the brazing filler material 4, it is also possible to use an active metal brazing filler material that is obtained by adding to the silver-copper eutectic brazing filler material an active metal such as titanium or its hydrides in an amount of 2 to 5 wt %.

Figure 3:
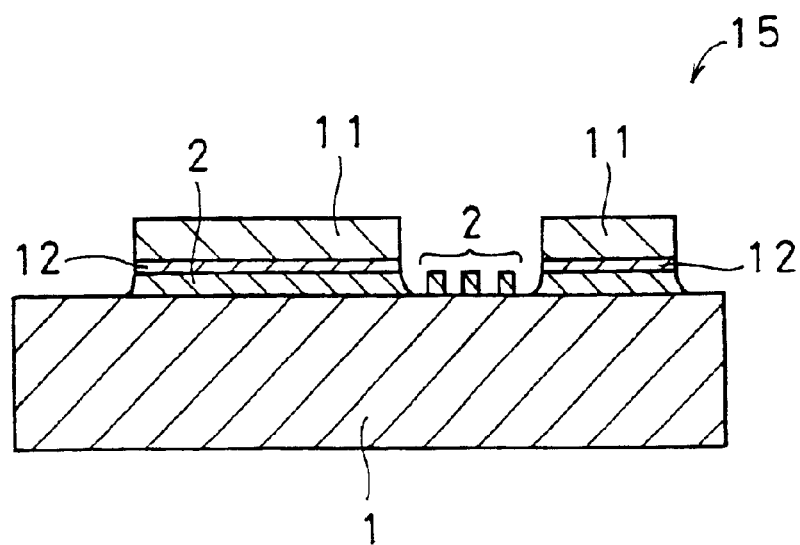
FIG. 3 is a cross-sectional view showing a third embodiment of the ceramic circuit board according to the invention.

FIG. 3 is a cross-sectional view showing a third embodiment of the ceramic circuit board according to the invention. In the third embodiment, the components that play the same or corresponding roles as in the above-described embodiments will be identified with the same reference symbols, and overlapping descriptions will be omitted.

A ceramic circuit board 15 of the third embodiment has basically the same structure as the ceramic circuit board 5 of the first embodiment except that, in the former, the metal circuit plate 11 is made of aluminum and so designed that, if it is assumed that a sectional area thereof is S (mm$^2$) and that a value of a flowing electric current is i (A), a condition: $S \geq 9 \times 10^{-5} i^2$ fulfilled.

The ceramic circuit board 15 includes a ceramic substrate 1, a metallized wiring layer 2, and a metal circuit plate 11.

The ceramic substrate 1 is rectangular-shaped and has a plurality of metallized wiring layers 2 attached to the top surface thereof. The metal circuit plate 11 is placed in part of the metallized wiring layers 2.

The ceramic substrate 1 of the third embodiment is identical in function, material, and manufacturing method with that of the first embodiment, and thus no overlapping description will be given.

The metallized wiring layer 2 of the third embodiment is identical in function, material, and thickness with that of the first embodiment, and thus no overlapping description will be given.

The metal circuit plate 11, made of aluminum, having a low resistivity (resistivity: $2.65 \times 10^{-6}$ Ω·cm) is placed by brazing in the region of the metallized wiring layer 2 through which a large current of approximately 10 A flows. The metal circuit plate 11 is so designed as to satisfy a condition: $S \geq 9 \times 10^{-5} i^2$, wherein S represents the sectional area (mm$^2$) and i represents the value of the flowing electric current (A). Therefore, even if a large electric current of approximately 10 A is applied to the metallized wiring layer 2, the metal circuit plate 11 enables the electric current to flow smoothly, and simultaneously generation of intense Joule heat can be prevented effectively. As a result, the ceramic circuit board is capable of functioning properly and stably for a longer period of time.

The aluminum-made metal circuit plate 11 having a predetermined shape is obtained by subjecting an aluminum ingot (block) to a conventionally-known metal processing method such as a rolling processing method or stamping processing method. The metal circuit plate 11 is placed, via a brazing filler material 12 such as aluminum solder, in the region of the metallized wiring layer 2 through which a large current of approximately 10 A flows.

In the metal circuit plate 11, its sectional area is defined as S (mm$^2$) and a value of a flowing electric current is defined as i (A). In this case, if the relationship between S and i is given as: $S < 9 \times 10^{-5} i^2$, when a large electric current of approximately 10 is applied, not only the electric current fails to flow smoothly, but also intense Joule heat is generated, resulting in fusion. In light of this, the metal circuit plate 11 is so designed as to satisfy a condition: $S \geq 9 \times 10^{-5} i^2$, wherein S represents the sectional area (mm$^2$) and i represents the value of the flowing electric current (A).

Likewise to the first embodiment, it is preferable that a metal material which has excellent conductivity, is highly corrosion-resistant, and has excellent wettability with respect to solder (nickel, for example) is coated onto the surface of the metal circuit plate 11 in accordance with the plating method. This makes it possible to establish satisfactory electrical connection between the metal circuit plate 11 and external electric circuits, and to allow an electronic component such as a semiconductor element to be firmly bonded, via the solder, to the metal circuit plate 11.

Moreover, where the metal circuit plate 11 has its surface plated with a layer, the plate layer should preferably be made of a nickel-phosphorus amorphous alloy containing phosphorus in an amount of 8 to 15 wt %. This makes it possible to protect the surface of the plate layer against oxidation and to maintain the wettability with respect to the solder for a longer period of time.

Further, where the metal circuit plate 11 has its surface plated with a layer made of a nickel-phosphorus amorphous alloy, if the content of phosphorus relative to nickel is less than 8 wt % or exceeds 15 wt %, formation of the nickel-phosphorus amorphous alloy becomes difficult, with the result that the solder cannot be firmly bonded to the plate layer. Accordingly, where the metal circuit plate 11 has its surface plated with a layer made of a nickel-phosphorus amorphous alloy, the content of phosphorus relative to nickel should preferably be kept within a range of 8 to 15 wt %, more preferably, 10 to 15 wt %.

Still further, if the plate layer coated onto the surface of the metal circuit plate 11 is less than 1.5 μm in thickness, the surface of the metal circuit plate 11 cannot be wholly covered with the plate layer. This makes it impossible to effectively protect the metal circuit plate 11 against corrosion due to oxidation. By contrast, if the thickness of the plate layer exceeds 3 μm, a large internal stress is developed inside the plate layer, with the result that the ceramic substrate 1 suffers from warpage or crack. In particular, where the ceramic substrate 1 is made so thin as to have a thickness of 700 μm or less, it is inevitable that warpage or crack appears more notably. Thus, the thickness of the plate layer coated onto the surface of the metal circuit plate 11 should preferably be kept within a range of 1.5 to 3 μm.

The brazing filler material 12, which is used to braze the metal circuit plate 11 to the metallized wiring layer 2, acts as a bonding member for bonding the metal circuit plate 11 to the metallized wiring layer 2. For example, a brazing filler material made of aluminum solder (aluminum-silicon eutectic brazing filler material containing aluminum in an amount of 88 wt % and silicon in an amount of 12 wt %) is preferably employed.

The following is a procedure for placing the metal circuit plate 11 in the metallized wiring layer 2 with the use of the brazing filler material 12. Firstly, an organic solvent is mixedly added to powder of the brazing filler material 12 to form a brazing filler paste. The paste is then printed onto the metallized wiring layer 2 in a predetermined shape in accordance with a conventionally-known printing technique such as a screen printing method. Then, the metal circuit plate 11 is placed thereon. Secondly, the component thus obtained is heated in a vacuum, neutral atmosphere, or reducing atmosphere at a predetermined temperature (approximately 600° C.) to keep the brazing filler material 12 molten, thereby bonding the top surface of the metallized wiring layer 2 to the under surface of the metal circuit plate 11. As a result, the metal circuit plate 11 is attached, via the brazing filler material 12, to the metallized wiring layer 2.

Thus, according to the ceramic circuit board described above, on the ceramic substrate 1 are mounted electronic components such as an IGBT (Insulated Gate Bipolar Transistor) or power-FET (Field Effect Transistor). The electrodes of the electronic components are connected to the metallized wiring layer 2 and the metal circuit plate 11, and thereby the mounted electronic components are electrically connected to each other via the metallized wiring layer 2 and the metal circuit plate 11. Moreover, the metallized wiring layer 2 is connected to a specified external electric circuit so that the mounted electronic components are electrically connected to the external electric circuit. In this way, it is possible to accomplish the function of the ceramic circuit board.

Next, a fourth embodiment of the invention will be described with reference to FIG. 4.

Note that, in the figure, the components that play the same or corresponding roles as in the above-described embodiments will be identified with the same reference symbols.

Figure 4:
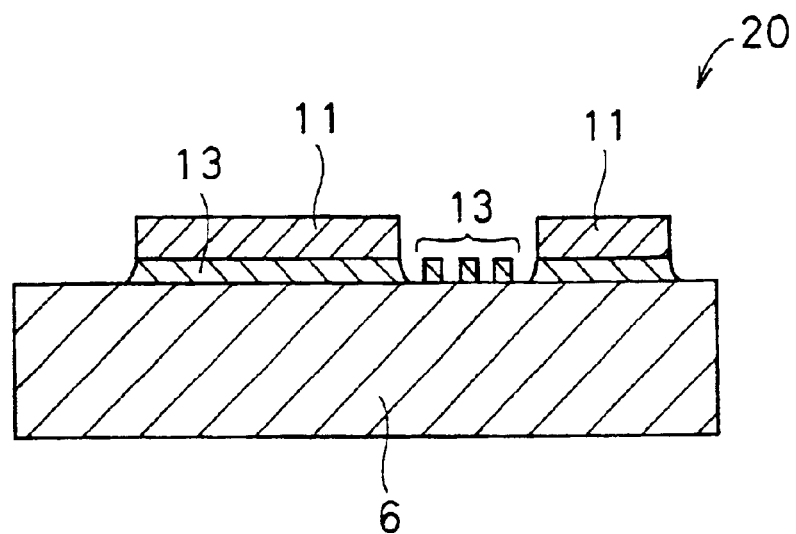
FIG. 4 is a cross-sectional view showing a fourth embodiment of the ceramic circuit board according to the invention.

A ceramic circuit board 20 shown in FIG. 4 has basically the same structure as the ceramic circuit board 10 of the second embodiment except that, in the former, the metal circuit plate 11 is made of aluminum and so designed that, if it is assumed that a sectional area thereof is S (mm$^2$) and that a value of a flowing electric current is i (A), a condition: $S \geq 9 \times 10^{-5} i^2$ is fulfilled.

The ceramic circuit board 20 is composed of a ceramic substrate 6, a metallized wiring layer 13, and a metal circuit plate 11.

The ceramic substrate 6 is rectangular-shaped and has a plurality of metallized wiring layers 13 attached to the top surface thereof. The metal circuit plate 11 is placed in part of the metallized wiring layer 13.

The ceramic substrate 6 serves as a supporting member for supporting the metallized wiring layer 13, and is made of an electrically insulating material such as sintered aluminum oxide, mullite, silicon nitride, aluminum nitride or silicon carbide.

The ceramic substrate 6 of the fourth embodiment is fabricated in the same manner as in the second embodiment, and thus no overlapping description will be given.

Moreover, the ceramic substrate 6 has, on its surface, a plurality of metallized wiring layers 13 that serve as transmission paths for supplying predetermined electric signals or power to an electronic component to be mounted on the ceramic substrate 6.

The metallized wiring layer 13 is made of an aluminum-silicon eutectic alloy added with at least one of titanium, zirconium, hafnium, and their hydrides in an amount of 2 to 5 wt %. Firstly, a suitable organic binder, plasticizer, or solvent is mixedly added to the alloy powder to form a metal paste. The metal paste is printed onto the ceramic substrate 6 in a predetermined pattern in accordance with the conventionally-known screen printing method. Secondly, the component thus obtained is fired in a vacuum, neutral atmosphere, or reducing atmosphere at a temperature of approximately 600° C. As a result, the metallized wiring layer 13 having a predetermined thickness is coated onto the top surface of the ceramic substrate 6 in a predetermined pattern.

Moreover, the metal circuit plate 11, made of aluminum, having a low resistivity (resistivity: $2.65 \times 10^{-6}$ Ω·cm) is placed in the region of the metallized wiring layer 13 through which a large electric current of approximately 10 A flows. The metal circuit plate 11 is so designed as to satisfy a condition: $S \geq 9 \times 10^{-5} i^2$, wherein S represents the sectional area (mm$^2$) and i represents the value of the flowing electric current (A) Therefore, even if a large electric current of approximately 10 A is applied to the metallized wiring layer 13, the metal circuit plate 11 enables the electric current to flow smoothly, and simultaneously generation of intense Joule heat can be prevented effectively. As a result, the ceramic circuit board is capable of functioning properly and stably for a longer period of time.

The aluminum-made metal circuit plate 11 having a predetermined shape is obtained by subjecting an aluminum ingot (block) to a conventionally-known metal processing method, such as a rolling processing method or stamping processing method. The metal circuit plate 11 is placed in the region of the metallized wiring layer 13 through which a large current of approximately 10 A flows.

In the metal circuit plate 11, its sectional area is defined as S (mm$^2$) and a value of a flowing electric current is defined as i (A). In this case, if the relationship between S and i is given as: $S < 9 \times 10^{-5} i^2$, when a large electric current of approximately 10 A is applied, not only the current fails to flow smoothly, but also intense Joule heat is generated, resulting in fusion. In light of this, the metal circuit plate 11 is so designed as to satisfy a condition: $S \geq 9 \times 10^{-5} i^2$, wherein S represents the sectional area (mm$^2$) and i represents the value of the flowing electric current (A).

Placement of the metal circuit plate 11 in the metallized wiring layer 13 is achieved by exploiting the reactivity of the metallized wiring layer 13. More specifically, a metal paste (for example, an aluminum-silicon eutectic alloy added with at least one of titanium, zirconium, hafnium, and their hydrides), which is formed into the metallized wiring layer 13, is printed onto the ceramic substrate 6 in a predetermined pattern. Then, on the metal paste printed in the predetermined pattern is placed the metal circuit plate 11. Subsequently, the component thus obtained is fired in a vacuum, neutral atmosphere, or reducing atmosphere at a temperature of approximately 600° C., thereby attaching the metal circuit plate 11 to the metallized wiring layer 13.

Likewise to the second embodiment, it is preferable that a 1 to 20 μm-thick metal material which has excellent conductivity, is highly corrosion-resistant, and has excellent wettability with respect to solder (nickel or gold, for example) is coated onto the exposed surfaces of the metallized wiring layer 13 and the metal circuit plate 11 in accordance with the plating method. This makes it possible to effectively protect the metallized wiring layer 13 and the metal circuit plate 11 against corrosion due to oxidation, to allow the metallized wiring layer 13, the metal circuit plate 11, and the electronic components which are mounted on the metallized wiring layer 13 and the metal circuit plate 11, to be firmly bonded to one another via the electrodes of the electronic components, and to establish satisfactory electrical connection between the metallized wiring layer 13, the metal circuit plate 11 and the external electric circuits.

In a case where the metallized wiring layer 13 and the metal circuit plate 11 have their surfaces plated with a layer, the plate layer should preferably be made of a nickel-phosphorus amorphous alloy containing phosphorus in an amount of 8 to 15 wt %. This makes it possible to protect the surface of the plate layer against oxidation and to maintain the wettability with respect to the solder for a longer period of time.

Moreover, where the metallized wiring layer 13 and the metal circuit plate 11 have their surfaces plated with a layer made of a nickel-phosphorus amorphous alloy, if the content of phosphorus relative to nickel is less than 8 wt % or exceeds 15 wt %, formation of the nickel-phosphorus amorphous alloy becomes difficult, with the result that the solder cannot be firmly bonded to the plate layer. Accordingly, where the metallized wiring layer 13 and the metal circuit plate 11 have their surfaces plated with a layer made of a nickel-phosphorus amorphous alloy, the content of phosphorus relative to nickel should preferably be kept within a range of 8 to 15 wt %, more preferably, 10 to 15 wt %.

Further, if the plate layer coated onto the surfaces of the metallized wiring layer 13 and the metal circuit plate 11 is less than 1.5 μm in thickness, the surfaces of the metallized wiring layer 13 and the metal circuit plate 11 cannot be wholly covered with the plate layer. This makes it impossible to effectively protect the metallized wiring layer 13 and the metal circuit plate 11 against corrosion due to oxidation. By contrast, if the thickness of the plate layer exceeds 3 μm, a large internal stress is developed inside the plate layer, and thus the ceramic substrate 6 suffers from warpage or crack. In particular, where the ceramic substrate 6 is made so thin as to have a thickness of 700 μm or less, it is inevitable that warpage or crack appears more notably. Thus, the thickness of the plate layer coated onto the surfaces of the metallized wiring layer 13 and the metal circuit plate 11 should preferably be kept within a range of 1.5 to 3 μm.

Thus, according to the ceramic circuit board described above, on the ceramic substrate 6 are mounted electronic components such as an IGBT (Insulated Gate Bipolar Transistor) or power-FET (Field Effect Transistor). The electrodes of the electronic components are connected to the metallized wiring layer 13 and the metal circuit plate 11, and thereby the mounted electronic components are electrically connected to each other via the metallized wiring layer 13 and the metal circuit plate 11. Moreover, the metallized wiring layer 13 is connected to a specified external electric circuit so that the mounted electronic components are electrically connected to the external electric circuit. In this way, it is possible to accomplish the function of the ceramic circuit board.

It should be noted that the invention is not limited to the above-described embodiments and examples and therefore various changes and modifications may be made without departing from the spirit or scope of the invention. For example, although, in the above-described examples, an aluminum-silicon eutectic brazing filler material is used as the brazing filler material 12, it is also possible to use an active metal brazing filler material that is obtained by adding to the aluminum-silicon eutectic brazing filler material an active metal such as titanium or its hydrides in an amount of 2 to 5 wt %.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A ceramic circuit board comprising:
    a ceramic substrate;
    a plurality of metallized wiring layers formed on the ceramic substrate, wherein the metallized wiring layer is made of a silver-copper eutectic alloy added with at least one of titanium, zirconium, hafnium, and hydrides thereof; and
    a metal circuit plate made of copper, which is attached to part of the metallized wiring layers,
    wherein a condition: $S \geq 6 \times 10^{-5} i^2$ is fulfilled, wherein S is a sectional area (mm$^2$) of the metal circuit plate and i is a value (A) of a flowing electric current.

2. The ceramic circuit board of claim 1,
    wherein the metal circuit plate has a surface plated with a layer that is made of a nickel-phosphorus amorphous alloy containing phosphorus in an amount of 8 to 15 wt %.

3. The ceramic circuit board of claim 2,
    wherein the ceramic substrate has a thickness of 700 μm or less, and the plate layer has a thickness ranging from 1.5 to 3 μm.

4. The ceramic circuit board according to claim 1,
    wherein the ceramic substrate is made of an insulating material selected from the group consisting of aluminum oxide, mullite, silicon nitride, aluminum nitride and silicon carbide.

5. The ceramic circuit board according to claim 1,
    wherein the copper of the metal circuit plate is essentially oxygen free.

6. A ceramic circuit board comprising:
    a ceramic substrate;
    a plurality of metallized wiring layers formed on the ceramic substrate, wherein the metallized wiring layer is made of a silver-copper eutectic alloy added with at least one of titanium, zirconium, hafnium, and hydrides thereof; and
    a metal circuit plate made of aluminum, which is attached to part of the metallized wiring layers,
    wherein a condition: $S \geq 9 \times 10^{-5} i^2$ is fulfilled, wherein S is a sectional area (mm$^2$) of the metal circuit plate and i is a value (A) of a flowing electric current.

7. The ceramic circuit board of claim 6,
    wherein the metal circuit plate has a surface plated with a layer that is made of a nickel-phosphorus amorphous alloy containing phosphorus in an amount of 8 to 15 wt %.

8. The ceramic circuit board of claim 6,
    wherein the ceramic substrate has a thickness of 700 μm or less, and the plate layer has a thickness ranging from 1.5 to 3 μm.

9. The ceramic circuit board according to claim 6,
    wherein the ceramic substrate is made of an insulating material selected from the group consisting of aluminum oxide, mullite, silicon nitride, aluminum nitride and silicon carbide.

10. A ceramic circuit board comprising:
    a ceramic substrate;
    a plurality of metallized wiring layers formed on the ceramic substrate, wherein the metallized wiring layer is made of a metal selected from the group consisting of tungsten, molybdenum and manganese; and
    a metal circuit plate made of copper, which is attached to part of the metallized wiring layers,
    wherein a condition: $S \geq 6 \times 10^{-5} i^2$ is fulfilled, wherein S is a sectional area (mm$^2$) of the metal circuit plate and i is a value (A) of a flowing electric current.

11. The ceramic circuit board according to claim 10,
    wherein the metal circuit plate has a surface plated with a layer that is made of a nickel-phosphorus amorphous alloy containing phosphorus in an amount of 8 to 15 wt %.

12. The ceramic circuit board according to claim 10,
    wherein the ceramic substrate has a thickness of 700 μm or less, and the plate layer has a thickness ranging from 1.5 to 3 μm.

13. The ceramic circuit board according to claim 10,
    wherein the ceramic substrate is made of an insulating material selected from the group consisting of aluminum oxide, mullite, silicon nitride, aluminum nitride and silicon carbide.

14. The ceramic circuit board according to claim 10,
    wherein the copper of the metal circuit plate is essentially oxygen free.

15. A ceramic circuit board comprising:

a ceramic substrate;

a plurality of metallized wiring layers formed on the ceramic substrate, wherein the metallized wiring layer is made of a metal selected from the group consisting of tungsten, molybdenum and manganese; and a metal circuit plate made of aluminum, which is attached to part of the metallized wiring layers, wherein a condition: $S \geq 9 \times 10^{-5} i^2$ is fulfilled, wherein S is a sectional area (mm$^2$) of the metal circuit plate and i is a value (A) of a flowing electric current.

16. The ceramic circuit board according to claim 15, wherein the metal circuit plate has a surface plated with a layer that is made of a nickel-phosphorus amorphous alloy containing phosphorus in an amount of 8 to 15 wt %.

17. The ceramic circuit board according to claim 15, wherein the ceramic substrate has a thickness of 700 μm or less, and the plate layer has a thickness ranging from 1.5 to 3 μm.

18. The ceramic circuit board according to claim 15, wherein the ceramic substrate is made of an insulating material selected from the group consisting of aluminum oxide, mullite, silicon nitride, aluminum nitride and silicon carbide.

\* \* \* \* \*